United States Patent [19]

Richter

[11] Patent Number: 5,598,088

[45] Date of Patent: Jan. 28, 1997

[54] METHOD FOR DETERMINING THE CHARGE STATE OF A BATTERY, IN PARTICULAR A VEHICLE STARTER BATTERY

[75] Inventor: Gerolf Richter, Hildesheim, Germany

[73] Assignee: Robert Bosch GmbH, Stuttgart, Germany

[21] Appl. No.: 491,884

[22] PCT Filed: Nov. 17, 1994

[86] PCT No.: PCT/DE94/01349

§ 371 Date: Jun. 23, 1995

§ 102(e) Date: Jun. 23, 1995

[87] PCT Pub. No.: WO95/14239

PCT Pub. Date: May 26, 1995

[30] Foreign Application Priority Data

Nov. 19, 1993 [DE] Germany .......................... 43 39 568.6

[51] Int. Cl.[6] .......................... H01M 10/44; G01R 31/36; G01N 27/416
[52] U.S. Cl. .................................. 320/48; 324/431
[58] Field of Search .......................... 320/43, 48, 31, 320/37; 324/427, 429, 431

[56] References Cited

U.S. PATENT DOCUMENTS

| 4,952,862 | 8/1990 | Biagetti et al. | 320/48 |
| 5,321,627 | 6/1994 | Reher | 320/48 X |
| 5,397,991 | 3/1995 | Rogers | 320/48 X |

FOREIGN PATENT DOCUMENTS

| 3520985 | 12/1986 | Germany . |
| WO92/15893 | 9/1992 | WIPO . |

*Primary Examiner*—Peter S. Wong
*Assistant Examiner*—Patrick B. Law
*Attorney, Agent, or Firm*—Michael J. Striker

[57] ABSTRACT

A method is specified for determining the charge state of a battery, for example a vehicle starter battery, in which a charge balance is carried out by evaluating the charging current and the discharging current. This charge balance is checked with the aid of the measured battery open-circuit voltage and corrected. Depending on further variables, for example, the battery temperature, a time interval is determined which can be used to detect how long the battery can still supply an acceptable discharging current under the given conditions. This time interval is optimized with the aid of suitable correction functions, and serves as a measure of the present charge state of the battery.

6 Claims, 1 Drawing Sheet

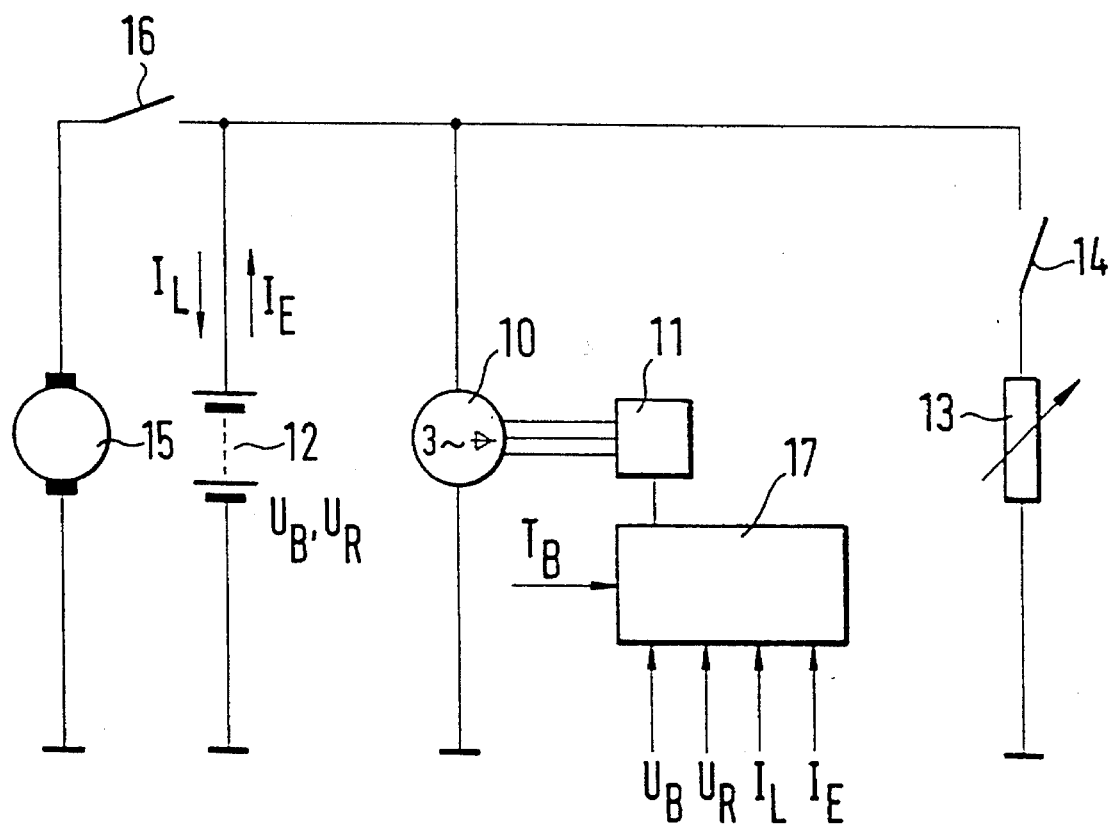

METHOD FOR DETERMINING THE CHARGE STATE OF A BATTERY, IN PARTICULAR A VEHICLE STARTER BATTERY

BACKGROUND OF THE INVENTION

The battery in a motor vehicle, which serves to supply the electrical systems and particularly also to supply the starter, is charged with the aid of a three-phase generator which is driven by the engine and whose output voltage is regulated in a suitable way. Since the battery must supply a multiplicity of consumers, it is possible under unfavorable operating conditions, for example given low temperatures and unfavorable driving conditions, for the battery to become discharged to such an extent that a reliable power supply is no longer guaranteed. In this case, starting the engine, in particular, can become problematical, since the starter requires considerable electrical energy.

It is therefore known to determine the energy content of the battery which is still available. A plurality of different methods have been carried out for this purpose; one of these methods consists in using measurement technology to determine the electrochemical battery state variables of acid density and the open-circuit voltage derived therefrom. However, this method is unreliable, since it would be necessary to take diffusion equalization times and temperature variations into account for a battery in operation.

A further method, which can be used, however, only in the steady state, consists in determining the internal resistance of the battery, which can serve as a measure of the charge state. The internal resistance can be determined in this case by observing the terminal voltage of the battery while a load pulse is applied to it.

A further possibility consists in determining the charge state of a battery, for example the starter battery of a motor vehicle, by continuously measuring the battery current and determining therefore the charge drawn from the battery by integrating over time. This mode of procedure is described in DE-OS 35 20 985. In accordance with the method described therein, the battery voltage is additionally measured after switching off the vehicle engine and a fictional battery capacity is computed from the reduction with respect to the voltage with a fully charged battery and the drawn charge calculated for the de-energized state. The charged state is then determined from this fictional battery capacity.

However, this method is still not yet reliable enough, since all battery systems have the unpleasant characteristic that the variation in capacity, and thus the residual capacity still available, referred to a defined final voltage, depends to a relatively large extent on a multiplicity of variables. Examples of these variables are the magnitude of the current drawn or supplied, the temperature, the age of the battery and the battery charge status, which has already been introduced.

SUMMARY OF THE INVENTION

It is an object of the present invention to provide a method of determining a charge state of a vehicle starter battery charged by a generator which avoids the above-described disadvantages and provides a reliable determination of the charge state.

According to the invention the method of determining a charge state of the comprises measuring a battery current of the starter battery and an open-circuit voltage of the starter battery in conjunction with detecting specific operating states; feeding the battery current and the open-circuit voltage to a computing means for drawing a conclusion regarding the charge state from measured variables including the battery current and the open-circuit voltage; measuring a battery temperature, a discharging current of the starter battery during a first time period and a charging current of the stater battery during a second time period, the discharging current being a current for which a predetermined value of a final voltage is reached after the first period; combining the measured parameters by correction functions formed at least according to the measured battery temperature and determining a third time period characterizing a residual time still available from a mutual relationship between the discharging current in the first time period and the charging current in the second time period.

The method according to the invention has, by contrast, the advantage that a very reliable conclusion can be made regarding the present charge state of the battery.

This advantage is achieved by precisely balancing the drawn current and the supplied current and making corrections which take account of the strength of the current, the temperature and the age of the battery. It is particularly advantageous that the corrections can be made with the aid of suitable functions in a computing device. In this case, a time interval is determined which represents an accurate statement with reference to the battery charge state. This time interval specifies how long the battery can still deliver a prescribable current.

Further advantages of the invention are achieved with the aid of the measures specified in the subclaims.

One advantageous measure consists in using the time interval which characterizes the charge state of the battery as a basis for regulating the generator. Furthermore, it is advantageously possible to produce a display when the time determined drops below a threshold value which can be fixed in a suitable way, and to indicate, for example, when the battery charge still present no longer suffices for a specific minimum number of starting tests.

DRAWING

An exemplary embodiment of the invention is represented in the drawing and explained in more detail in the following description. In this case, the sole figure is a diagrammatic representation of a vehicle electrical system with the variables essential to the invention.

DESCRIPTION OF THE EXEMPLARY EMBODIMENT

The vehicle electrical system represented in the figure comprises a generator 10, whose output voltage is regulated by the voltage regulator 11, a battery 12 which is charged by the generator, and the actual vehicle system consumers 13 which can be connected via connecting means 14 to the supply voltage.

15 denotes the starter, which can be connected to the battery via the ignition switch 16. 17 denotes a computing device, for example an integrated circuit or a control unit, to which various items of information are supplied and in which the method according to the invention for determining the charge state of the battery 12 is run.

The following are to be specified as variables supplied to the computing device 17: the battery voltage $U_B$, the open-circuit voltage $U_R$, the charging current $I_L$, the discharging current $I_E$ and the temperature of the battery.

The abovementioned variables are measured with the aid of suitable circuits or suitable sensors. The instant and the duration of the measurement is fixed by the computing device 17 itself. The computing device 17 comprises suitable means for storing data as well as suitable means for measuring times.

The actual determination of the battery charge state occurs in the computing device 17. In this process, the charge state is determined starting from balancing the current, that is to say from considering the charging currents flowing into the battery and the discharging currents flowing out of the battery, additional modeling and correction functions being taken into account. The results obtained are further corrected with the aid of the open-circuit voltage of the battery as determined after long interruptions.

The determination of the battery charge state described below applies, in particular, to the model of a maintenance-free lead-acid starter battery in a motor vehicle having approximately identical plate dimensions and a standardized acid density so that the water consumption during the average lifetime to be expected is negligibly small and does not lead to inaccuracies in the determination of the charge state.

The aging process to be taken into account is essentially dependent on the age of the battery and on the temperature, because under normal conditions which hold for a battery installed in a motor vehicle the battery ages almost independently of the driver performance or the frequency of starting tests. The influence of the average operating temperatures, which is not to be neglected, is measured empirically. Various measurements are required so that the method for determining the charge state can be run. Consequently, during operation the charging currents $I_L$ and the discharge currents $I_E$ are measured, for example, by means of a current probe, these measurements being performed within time intervals which last only fractions of a second, for example.

The open-circuit voltage $U_R$ of the battery 12 is measured during longer rest periods. Common present day circuits can be used to measure the battery voltage $U_B$. Measurement of the battery temperature $T_B$ is performed continuously, being required, on the one hand, to correct the open-circuit voltage and, on the other hand, to determine the capacity currently still available and to describe the age of the battery.

The measurement results are fed via suitable connections to the computing device 17. They can be stored there intermediately and are available to the computing device 17 for evaluation.

The logic operation on the measured variables and the correction measures can be represented in the following way:

1. DISCHARGING

The discharging current $I_E$ is measured in the time interval $\Delta t_{Ei}$. Since the mean discharging current for a passenger car is approximately the three-hour current $I_{3E}$ (the current for which a final voltage of U=10.5 V is reached after three hours of discharging at room temperature), the capacity $K_3$ is also valid as reference variable. The index 3 stands for three hours. $I_{3E0}$ must therefore also be available as a battery-specific input variable; the index 0 stands for "new battery". The current $I_{3E0}$ is measured with a new battery. It thus holds for an ideal battery in the ith measuring interval:

$$\Delta t_{3i} * I_{3E} = \Delta t_{Ei} * I_E$$

or the time "reduced" by the three-hour residual time $t_{3i}$ still available that:

$$\Delta t_{3i} = \Delta t_{Ei} * \frac{I_E}{I_{3E}}$$

As already mentioned, this time interval must be corrected for all real battery systems.

The empirical equations of Peukert or Liebenow have proved themselves in the case of the lead-acid battery. The following equations show the influence of these corrections.

a) According to Peukert, it holds that:

$$\Delta t_{3i} = \Delta t_{Ei} * \frac{I_E}{I_{3E}} \left( \frac{I_E}{I_{3E}} \right)^{n_E}$$

where $n_E \approx 0.2$ for a starter battery b) According to Liebenow, it holds that:

$$\Delta t_{3i} = \Delta t_{Ei} * \frac{I_E}{I_{3E}} (1 + \gamma * I_{Ei} \sqrt{\Delta t_{Ei}})$$

$I_E > I_{3E}$. The Peukert correction exhibits a particularly good agreement with the measured values for mean discharging currents, whereas the Liebenow equation guarantees a satisfactory approximation over the entire possible range of discharging currents with the above limitation.

2. CHARGING

The charge gain of a starter battery in the interval $\Delta t_{Li}$ must be multiplied by a charge efficiency $\eta_L$ which depends on the charge status. Since the charge current can be lost irreversibly only by gassing, for modern, maintenance-free batteries it is to be written that $\eta_L=1$, in particular when there is periodic monitoring of the open-circuit voltage during which the voltage $U_R$ is measured. The result for the gain in three hours' charging time in the measuring interval is:

$$\Delta t_{3i} = \Delta t_{Li} * \frac{I_L}{I_{3L}}$$

3. BALANCE OF CHARGING AND DISCHARGING

The current (in the ith interval) time $t_{3i}$ available during discharging by means of the actual $I_{3E}$ under normal conditions (room temperature) up to the final voltage of 10.5 V is $$t_{3i} = t_3 + \Sigma \Delta t_{3i} \text{ (charging +, discharging -)}$$

where $t_3 = 3$ h and $0 \leq t_{3i} \leq t_3$.

4. TAKING ACCOUNT OF THE AGE OF THE BATTERY OF THE AVERAGE TEMPERATURE LOAD

The input variable, characteristic of a new battery, for the computing program is the three-hour discharging current $I_{3E0}$. Laboratory experiments have shown in conjunction with driving tests which have been carried out that this value decreases continuously as a function of the age of the battery and the average temperature load and has the absolute value of $I_{3E}$ at the instant (age) of t. It holds with good agreement that $$I_{3E} = I_{3E0} [\beta + (1-\beta) e^{-t/\tau}]$$

where $\beta=0.5$ is the lowermost limit for a successful cold start.

The time constant for the aging process is chiefly a function of temperature due to the corrosion of the positive grid. This process can be well described using the following relationship $$\tau = \tau_0 \cdot 2^{-(T-20°C)/10°C}$$

and $\tau_0 \approx 2$ years.

Under these given assumptions, the change in $I_{3E}$ within the time interval $\Delta t_i$ has to be determined.

The result at the instant $t = \Sigma \Delta t_i$ is a dimensionless time $$t^* = \frac{\Sigma \Delta t_i}{\tau_i}$$

and thus for $$I_{3E} = -I_{3E0} \frac{\Delta t_i}{\tau_i} (1-\beta) e^{-t^*}$$

where:

$$\tau_i = \frac{\sum_{j=1}^{i} \tau_j}{i}$$

This yields $$i_{3E} = I_{3E0} - \Sigma I_{3E0} \frac{\Delta t_i}{\tau_i} (1-\beta) e^{-t^*}$$

as the computing equation for the current $I_{3E}$.

The three-hour current thus obtained represents the age-dependent three-hour capacity which can be drawn from a fully charged battery, and is the basic variable in the equations of Peukert and Liebenow, respectively.

5. AVAILABLE CAPACITY AT A GIVEN ELECTROLYTE TEMPERATURE

As already mentioned, the "standard time" $t_{ei}$ relates to the discharging case of a battery at an electrolyte temperature of 25° C. However, as the temperature drops the time $t_{3iV}$ actually available for a three-hour current becomes ever shorter.

It has been found that the temperature dependence in the temperature interval of interest, from −20° to +40° C., can be assumed, to a good approximation, to be linear. This holds, in particular, for currents of the order of magnitude of $$t_{3iV} = t_{3i} [1 + 0.006 (T-300)] \text{ with T in K}$$

considered here.

In practice, this time would be suitable, for example, for controlling or regulating the generator power by means of an appropriate voltage regulator in a passenger car electrical system. The control criteria can then be the exciting current and/or the voltage.

With regard to diverse alarm criteria such as, for example, for the information: "Note, three starts still possible under given conditions", it is necessary to carry out in the computing device a continuous comparison between a motor- and starter-specific ignition map with respect to a required current and starting time with the corresponding values from the charge state information.

The corrections according to points 4. and 5. are supplied by the computing instructions for $I_{3E}$. The associated equations are inserted as computing rules for $I_{3E}$ into the equations according to 1.a) and 1.b). The balancing equation for $t_{3i}$ with the previously substituted relationships for, $I_{3E}$ is the desired criterion for the charge state. It is a period which characterizes the residual time still available.

The determination of the charge state need not necessarily be conducted starting from a three-hour discharging time; a discharging time of approximately 2 to 6 hours would also be possible.

I claim:

1. A method of determining a charge state of a vehicle starter battery charged by a generator, said method comprising the steps of:
    a) measuring a battery current from the starter battery and an open-circuit voltage of the starter battery in conjunction with detecting specific operating states;
    b) feeding measured values of the battery current and the open-circuit voltage to computing means for drawing a conclusion regarding the charge state of the starter battery from measured variables including the battery current and the open-circuit voltage;
    c) measuring a battery temperature;
    d) combining the measured variables by correction functions formed at least according to the battery temperature measured in step c);
    e) measuring a discharging current of the starter battery during a first time period and measuring a charging current of the stater battery during a second time period, the discharging current being a current for which a final voltage is reached after the first time period; and
    f) determining a third time period characterizing a residual time still available from a mutual relationship established between the discharging current in the first time period and the charging current in the second time period determined.

2. The method as defined in claim 1, further comprising determining a discharging current from the third time period taking into account an exponential charging current dependence on the third time period.

3. The method as defined in claim 1, further comprising triggering a display to signal when the residual time is shorter than a predetermined threshold value.

4. The method as defined in claim 3, further comprising setting the predetermined threshold value so that a minimum number of starting tests can be carried out.

5. The method as defined in claim 1, further comprising computing available capacity of the starter battery for a predetermined temperature from the third time period.

6. The method as defined in claim 1, further comprising regulating the generator according to the residual time.

* * * * *